United States Patent
Hwang et al.

(10) Patent No.: US 6,621,164 B2
(45) Date of Patent: Sep. 16, 2003

(54) CHIP SIZE PACKAGE HAVING CONCAVE PATTERN IN THE BUMP PAD AREA OF REDISTRIBUTION PATTERNS AND METHOD FOR MANUFACTURING THE SAME

(75) Inventors: Chan Seung Hwang, Koonpo (KR); Seung Ouk Jung, Incheon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/209,344

(22) Filed: Jul. 30, 2002

(65) Prior Publication Data

US 2002/0185721 A1 Dec. 12, 2002

Related U.S. Application Data

(62) Division of application No. 09/672,379, filed on Sep. 28, 2000, now Pat. No. 6,455,408.

(30) Foreign Application Priority Data

Sep. 30, 1999 (KR) ........................................ 1999-41883

(51) Int. Cl.[7] ............................................... H01L 23/48
(52) U.S. Cl. ...................................... 257/738; 257/780
(58) Field of Search .............................. 257/737, 738, 257/778, 780; 438/614, 612, 613, 108, 616, 618, 620; 29/840

(56) References Cited

U.S. PATENT DOCUMENTS

| | | | |
|---|---|---|---|
| 5,736,456 A | 4/1998 | Akram | 438/614 |
| 6,218,281 B1 | 4/2001 | Watanabe et al. | 438/612 |
| 6,287,893 B1 | 9/2001 | Elenius et al. | 438/108 |
| 6,400,021 B1 * | 6/2002 | Cho | 257/738 |
| 6,449,838 B2 * | 9/2002 | Murakami | 29/840 |

FOREIGN PATENT DOCUMENTS

JP 63076339 4/1988 ........... H01L/21/60

OTHER PUBLICATIONS

Ezawa et al., Eutectic Sn–Ag Solder Bump Process for ULSI Flip Chip Technology, IEEE Transactions on Electronic Packaging Manufacturing, vol. 24, No. 4, Oct. 2001, pp. 275–281.*

* cited by examiner

Primary Examiner—Long Pham
Assistant Examiner—Hoa B. Trinh
(74) Attorney, Agent, or Firm—Harness, Dickey & Pierce, P.L.C.

(57) ABSTRACT

A semiconductor device including a semiconductor integrated circuit chip having a semiconductor substrate, a plurality of chip pads positioned on a surface of the substrate, a passivation layer formed on the substrate and having openings to expose the chip pads. A first polymer layer is formed on the passivation layer, a patterned first under barrier metal (UBM) layer formed on the chip pads and the first polymer layer, a plurality of redistribution pattern formed on the first UBM, with each redistribution pattern having a concave pattern in a bump pad area. A second polymer layer is formed on the first polymer layer and the redistribution pattern, the second polymer layer having openings for exposing the bump pad areas, a second under barrier metal (UBM) formed on the bump pads. A plurality of solder bumps is formed on the second UBM and electrically connected to the redistribution pattern in the bump pad area. A method for manufacturing semiconductor devices, includes providing a semiconductor wafer including a plurality of chip pads, and applying a passivation layer on the wafer, leaving the chip pads exposed. A first polymer layer is formed on the passivation layer and an under barrier metal (UBM) layer is formed on the first polymer layer. A plurality of redistribution patterns are formed on the UBM, the redistribution patterns being connected to chip pads, and the redistribution patterns having a bump pad area for receiving a solder bump. The bump pad area, which is formed during the definition of the redistribution pattern, is formed with a concave pattern.

10 Claims, 10 Drawing Sheets

CHIP SIZE PACKAGE HAVING CONCAVE PATTERN IN THE BUMP PAD AREA OF REDISTRIBUTION PATTERNS AND METHOD FOR MANUFACTURING THE SAME

CROSS-REFERENCE TO RELATED APPLICATION

This application is a divisional of U.S. patent application Ser. No. 09/672,379, filed Sep. 28, 2000 now U.S. Pat. No. 6,455,408.

BACKGROUND OF THE INVENTION

1. Field of the Invention

The present invention generally relates to a semiconductor device and a method for manufacturing the semiconductor devices, and more particularly to a chip size package having a concave pattern in bump pad and a method for manufacturing the same.

2. Description of the Related Arts

The electronic industry has been progressing with the miniaturization of electronic devices. This trend influences semiconductor packaging technology, which enables the connection between bare IC chips and other components. Typically, a semiconductor package has a footprint much larger than that of the chip. To adapt to the miniaturization trend, the size difference between the package and the chip has been reduced, producing a new package type called a Chip Scale Package (or a Chip Size Package) (CSP). Among the manufacturing technologies for the CSPs is Wafer Level Chip Scale Packaging, which assembles CSPs at the wafer level, rather than separately processing individual chips. The WLCSPs use a redistribution or a rerouting technology, which moves wiring attachment points from the electrode pads on the chip to other terminal pads. An external connection terminal such as a solder bump is formed on each redistributed terminal pad.

FIG. 1 schematically shows a semiconductor wafer 10, which includes integrated circuit chips 20 and scribe lines 14 dividing the chips 20. As shown in FIG. 2, which is an enlarged view of portion A of FIG. 1, chip pads 22 are on each chip 20, and a passivation layer 24 covers the upper surface of the IC chip 20 except where openings through the passivation layer 24 expose the chip pads 22.

Referring to FIGS. 3 and 4, in conventional wafer level chip scale packaging, a dielectric layer 34 and solder bumps 36 are formed on the surface of the wafer 10. The solder bumps 36 electrically connect to the chip pads 22 of FIG. 2. Then, a sawing apparatus is used to separate the wafer 10 along the scribe lines 14, producing individual chips 30.

FIG. 4 illustrates the cross-sectional structure of the CSP 30. The solder bump 36 connects the chip pad 22 through a redistribution pattern 33, and a first and a second polymer layer 31 and 34, respectively, under and on the redistribution pattern 33. Integrated circuits (not shown) are under the chip pad 22 and the passivation layer 24. In the fabrication of the CSPs 30 on the wafer 10, the first polymer layer 31 for the stress buffering and the electrical insulation is formed and patterned on the wafer 10 such that openings in the first polymer layer 31 expose the chip pads 22. Under barrier metal (UBM) 32 is deposited on the chip pad 22 and first polymer layer 31. Then, the redistribution pattern 33 is formed on the UBM 32, and the second polymer layer 34 is formed on the redistribution pattern 33 such that the openings in the second polymer layer 34 expose a portion of the redistribution pattern 33. Finally, UBM 35 and the solder bump 36 are formed on the exposed portion of the redistribution pattern 33.

The CSP 30 is attached to an external substrate such as a printed circuit board through a plurality of the solder bumps 36. FIGS. 5 and 6 illustrate how a solder joint can develop cracks. As shown in FIG. 5, a solder joint 42 binds the package 30 to a substrate 40. As known well, due to the dissimilarity of the coefficients of thermal expansion (CTE) between the chip constituting the package 30 and the substrate 40, changes in temperature create shearing stress F on the solder joint 42, as shown in FIG. 6. The shearing stresses often cause cracks 46 or delamination 44 of the solder joint 42.

SUMMARY OF THE INVENTION

The present invention is directed to chip size packages and methods for manufacturing the chip size packages. The method fabricates multiple chip size packages on a semiconductor wafer including integrated circuits, and separates the chip size packages by sawing.

In accordance with one aspect of the present invention, a semiconductor device is provided which comprises a semiconductor integrated circuit chip having a semiconductor substrate, a plurality of chip pads positioned on a surface of the semiconductor substrate, a passivation layer positioned on said surface of the semiconductor substrate, with the passivation layer including openings to expose said chip pads. A first polymer layer is formed on the passivation layer, with the first polymer layer having a first plurality of openings for exposing said chip pads. A patterned first barrier metal layer formed on the chip pads and the first polymer layer. A plurality of electrically conductive redistribution patterns are formed on the first barrier metal layer, each of said redistribution patterns including a bump pad area which includes a concave pattern, and a chip pad contact portion which is electrically connected to an associated chip pad.

The semiconductor device according to the above aspect further comprises a second polymer layer formed on the first polymer layer and said plurality of redistribution patterns, said second polymer layer having a plurality of openings, one for each bump pad area. A second barrier metal layer is formed on each of said redistribution patterns and a solder bump is positioned on each of the bump pad areas extending into the concave pattern at the bump pad area.

The semiconductor device according to the above aspect includes a third barrier metal layer positioned in each of said bump pad areas, the third barrier metal layer being interposed between the second barrier metal layer and a portion of the solder bump.

In accordance with another aspect of the invention, a method for manufacturing semiconductor devices is provided. The method comprises providing a semiconductor wafer having a semiconductor substrate including a plurality of chip pads; applying a passivation layer on the semiconductor substrate, and providing openings in said passivation layer to expose said chip pads; forming a first polymer layer on the passivation layer; forming a first barrier metal layer on the chip pads and the first polymer layer; forming a plurality of redistribution patterns on the first barrier metal layer, each redistribution pattern having a portion connected to the chip pads and having a bump pad area; and forming a concave pattern in said bump pad area.

The method further comprises the step of forming a second polymer layer on the first polymer layer and the redistribution patterns; removing a portion of the second polymer layer to expose at least a portion of the bump pad areas; forming a second barrier metal layer on the bump pads areas; and forming a solder bump on each of the bump pads areas.

In accordance with the present invention, wherein the concave pattern is formed in each bump pad area simultaneously with forming the redistribution pattern.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 7:
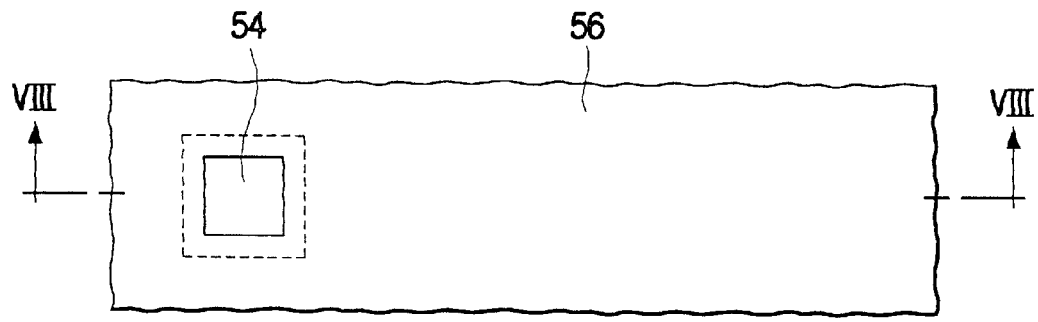
FIGS. 7 to 17 are cross-sectional or plan views of portions of a semiconductor wafer illustrating a method for manufacturing chip size package according to the present invention.
Figure 8:
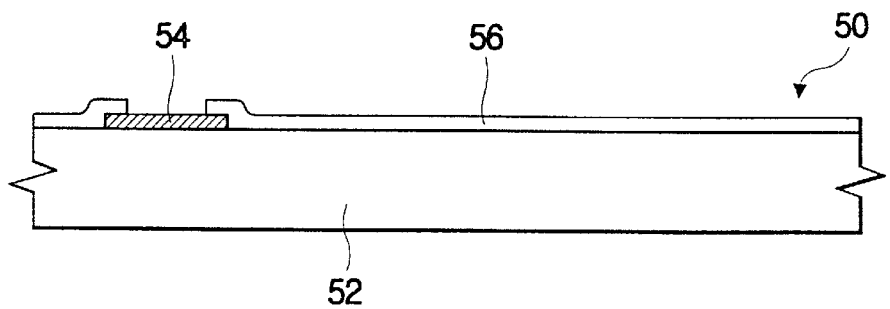

FIGS. 7 to 17 illustrate a method for manufacturing chip size package according to the present invention. Referring to FIGS. 7 and 8, a known wafer fabrication method produces a semiconductor wafer 50 including integrated circuits (not shown), chip pads 54, and a passivation layer 56 on a silicon wafer substrate 52. The chip pad 54 is made of a metal such as aluminum (Al), and an example of the passivation material used for passivation layer 56 is a nitride layer. Openings in the passivation layer 56 expose the chip pads 54. The wafer 50 also includes scribe lines (not shown), which divide the integrated circuits.

Figure 9:
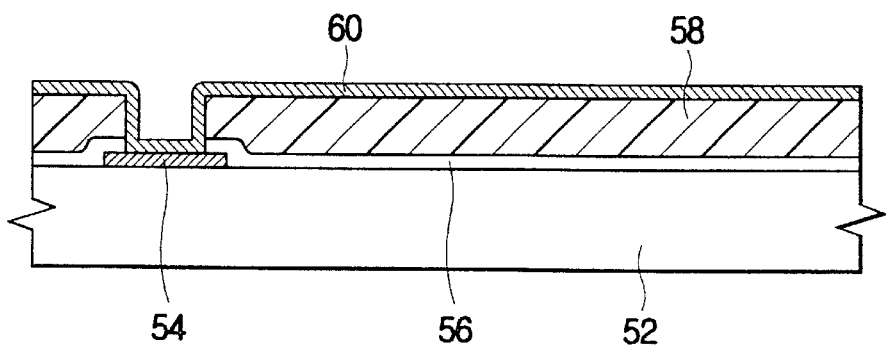

Referring to FIG. 9, a first polymer layer 58 is formed on passivation layer 56, and under barrier metal (UBM) 60 which is formed on the chip pad 54 and over first polymer layer 58. The first polymer layer 58 serves as a dielectric layer and a buffering layer for absorbing and buffering the thermal stress, and may be, for example, a polyimide, polybenzoxazole (PBO), benzocyclobutene (BCB), or an epoxy. The first polymer layer 58 may be formed by the known spin coating method and photolithographic process. The first polymer layer 58 is formed by coating a polymer on the whole surface of the wafer, removing the polymer portions on the chip pads 54, and curing the polymer. The first polymer layer 58 has a thickness of approximately 2 $\mu$m to 50 $\mu$m, and is cured at about 300° C. for 2 hours.

The UBM 60 is formed by the sputtering method, and serves as an adhesive layer, a barrier to diffusion and a plating base. Typically, the UBM 60 is multi-layered and includes titanium (Ti) and/or copper (Cu) layers. Other metal layers also can be part of the UBM 60, if necessary.

Figure 10:
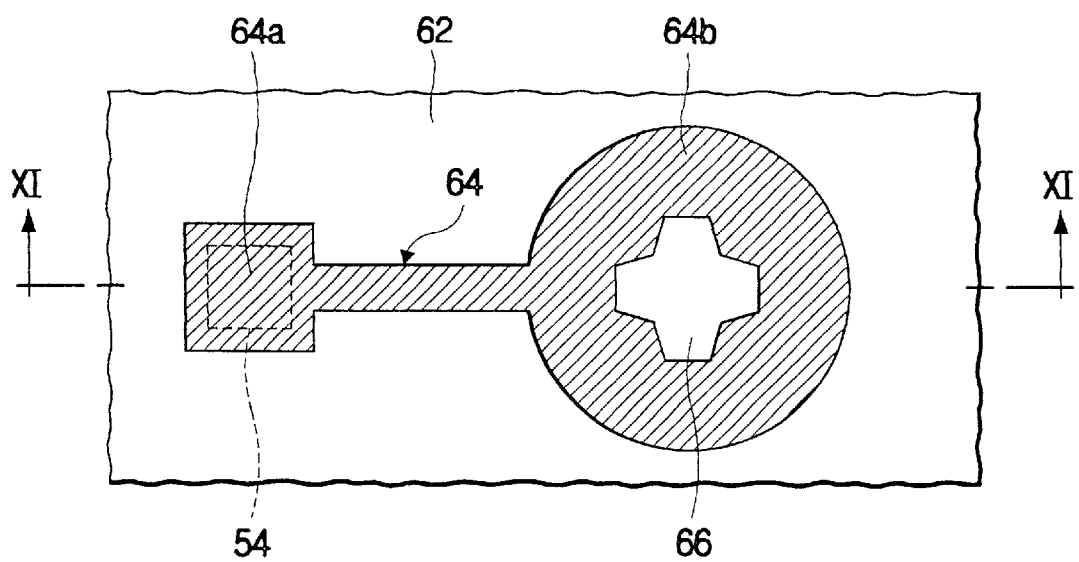
Figure 11:
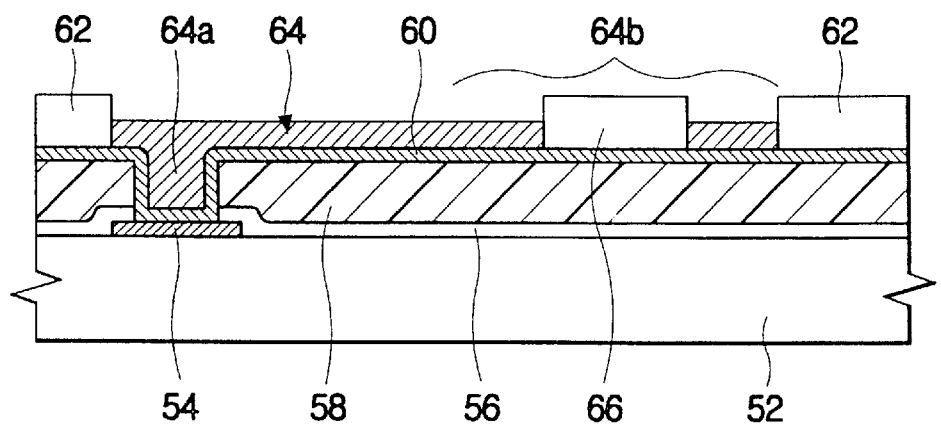

A redistribution pattern 64 is formed on the UBM 60. The redistribution pattern 64 is used to redistribute the point for contacting the pads. FIGS. 10 and 11 are a plan and a cross-sectional view, respectively, showing a structure of the redistribution pattern 64. One terminal 64a of the redistribution pattern 64 is electrically connected to the chip pad 54 through the UBM 60, and the other terminal 64b is used as a bump pad portion on which a solder bump (80 in FIG. 17) is to be formed.

Figure 12:
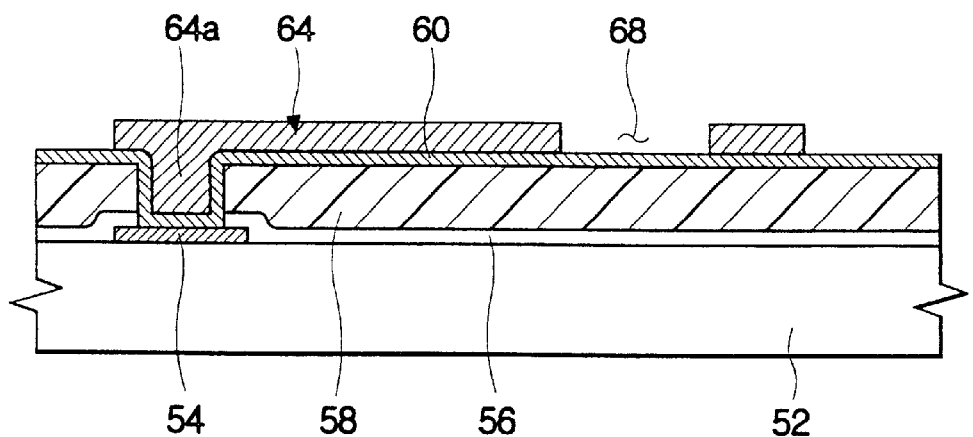

In forming the redistribution pattern 64, photoresist patterns 62 and 66 are used as a mask. The method of forming photoresist patterns 62 and 66 is well known in the art, that is, by depositing the photoresist on the whole surface of the UBM 60 and patterning the photoresist. A layer of copper is plated on the UBM portion which is exposed through the photoresist 62 and 66. After removing the photoresist patterns 62 and 66, the redistribution pattern 64 is obtained as shown in FIG. 12.

The barrier metal 60 can be used as a plating base for plating the redistribution pattern 64. The redistribution pattern 64 has a thickness of approximately 5 $\mu$m, and preferably uses a copper having an excellent electric characteristic, but, in some cases, may use aluminum (Al), zinc (Zn), iron (Fe), platinum (Pt), Cobalt (Co), lead (Pb), nickel (Ni), or their alloys.

In addition to the plating method, the redistribution pattern 64 can be formed by a deposition method such as a sputtering. A metal layer is deposited on the whole surface of the UBM 60, and partially removed with using the photoresist having the reverse pattern to the redistribution pattern 64 of FIG. 10.

When the redistribution pattern 64 is formed, a concave pattern is simultaneously formed in the bump pad portion 64b of the redistribution pattern 64. Referring to FIGS. 10 and 11, when the photoresist pattern 62 is used to form the redistribution pattern 64, the specific photoresist pattern 66 is formed on an area for the bump pad portion 64b. That is, photoresist pattern 62 covers the area of UBM 60 where redistribution pattern 64 is not to be formed, and the photoresist pattern 66 covers the area where the concave pattern is to be formed. By forming the redistribution pattern 64 and removing the photoresist patterns 62 and 66, a concave pattern 68 within the redistribution pattern 64 is formed as shown in FIG. 12. The concave pattern 68 in the bump pad portion 64b influences the solder joint.

When using the sputtering method to form the redistribution pattern, a metal layer is deposited on the whole surface of the UBM. Then, the photoresist patterns are formed only on an area of the metal layer where the redistribution pattern is to remain, and no photoresist is deposited where the concave pattern is to be formed. After etching the metal layer using the photoresist patterns as a mask and removing the photoresist patterns, the redistribution pattern and the concave pattern without the metal layer are simultaneously obtained.

Figure 13:
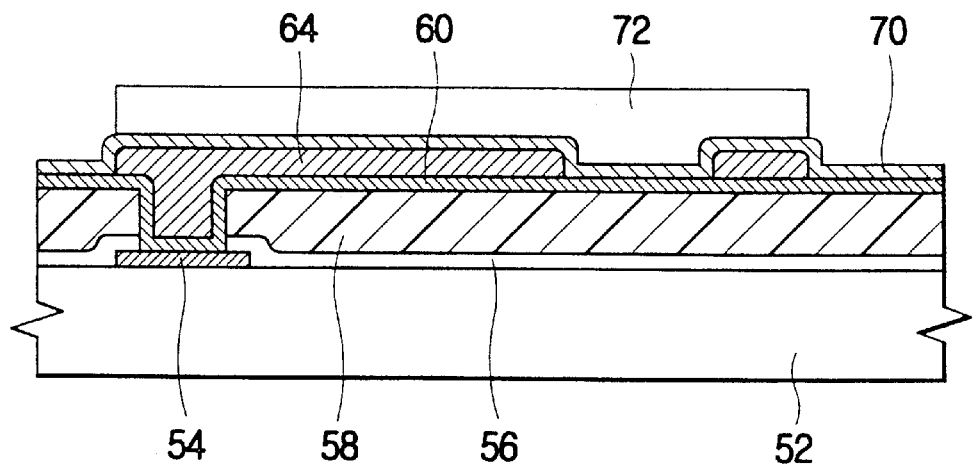

FIG. 13 illustrates a step of forming a barrier metal 70, after forming the redistribution pattern 64 and the concave pattern 68. The barrier metal 70 is deposited on the whole surface of the wafer by the sputtering method using titanium (Ti), palladium (Pb), chrome (Cr) or nickel (Ni). The barrier metal 70 prevents the oxidation of the redistribution pattern 64 and increases the adhesion between barrier metal 70 and a second polymer layer 74 (FIG. 16) to be formed thereon. Referring to FIG. 13, the photoresist 72 is coated on the barrier metal 70 in order to remove unnecessary portions of the barrier metal 70.

Figure 14:
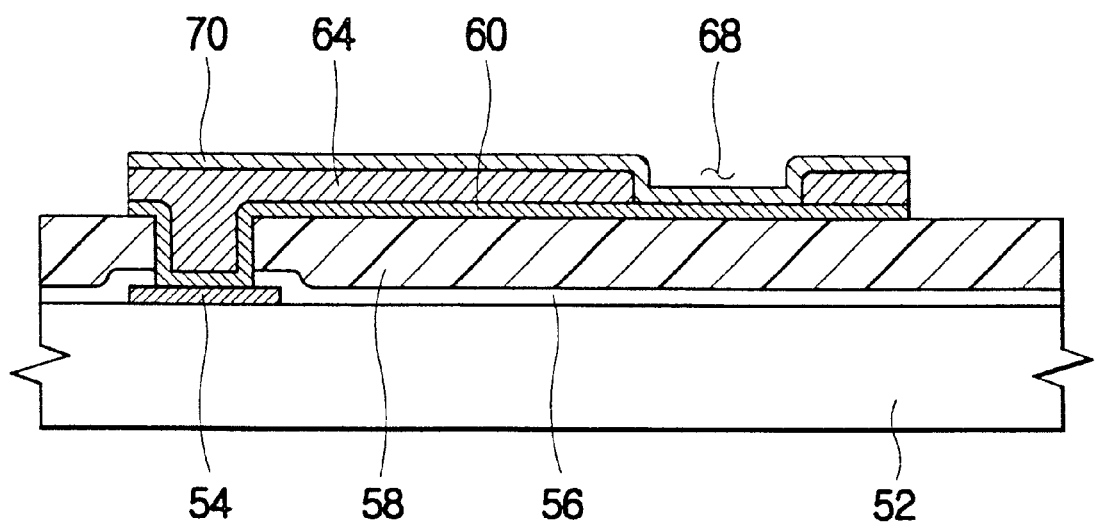

Referring to FIG. 14, the barrier metal 70 and the UBM 60 are etched by using the photoresist 72 as a mask. After removing the photoresist 72, the barrier metal 70 and the UBM 60 remain only on and under the redistribution pattern 64, and within the concave pattern 68.

Figure 15:
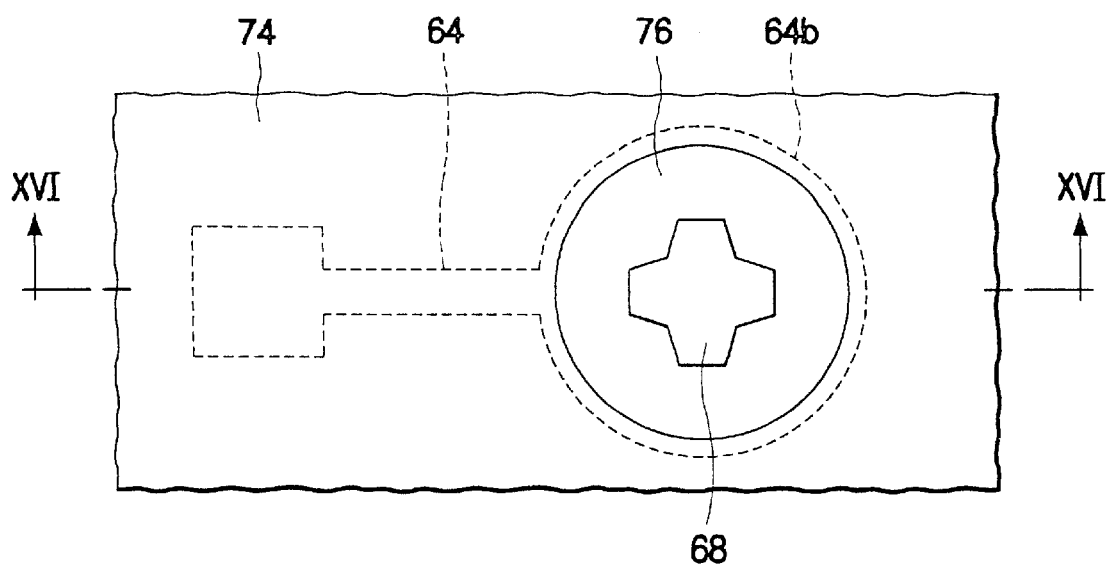
Figure 16:
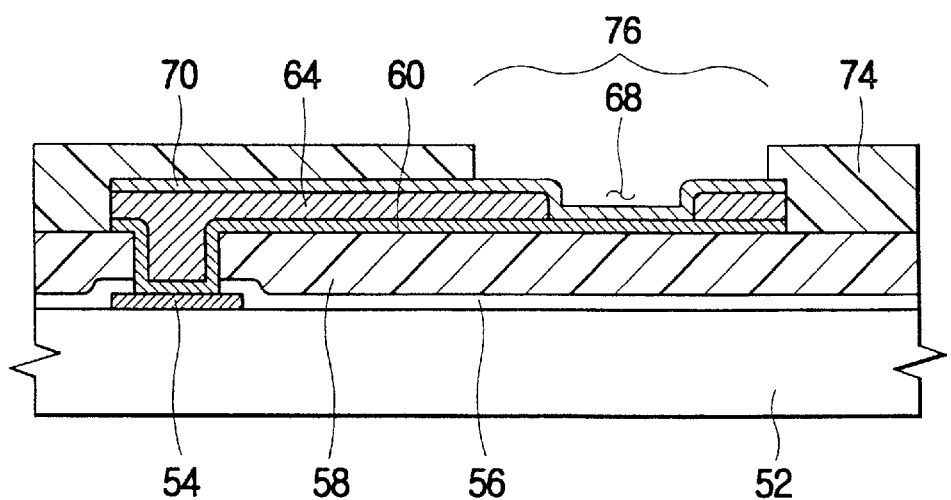

Referring to FIGS. 15 and 16, a second polymer 74 is deposited to the whole surface except for a bump pad 76 on which the solder bump 80 (FIG. 17) is to be formed. The second polymer layer 74 protects the redistribution pattern 64 from the external environmental stress, and is the same composition as first polymer layer 58 and is formed by the same method as used to form first layer 58. That is, the second polymer layer 74 and the bump pad 76 are formed by coating a polyimide and partially removing the polyimide by the photolithography process.

Figure 17:
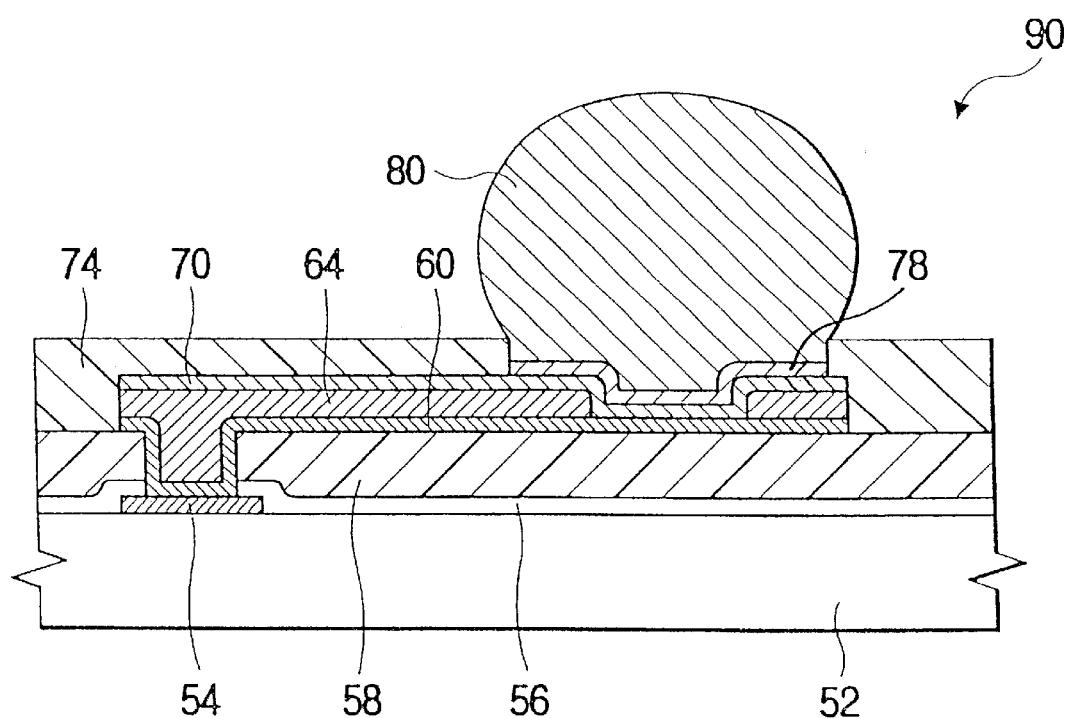

Prior to forming the solder bump on the bump pad 76, a UBM 78 is formed on the bump pad 76. As shown in FIG. 17, the UBM 78 is formed on the bump pad 76 and the solder ball is attached thereto. The UBM 78 is formed by the sputtering or the plating methods, and may be formed from materials such as nickel (Ni), gold (Au), titanium (Ti), copper (Cu), palladium (Pd), chrome (Cr), or aluminum (Al) layers. Other metal layers also can be part of the UBM 60, if necessary. Although the current embodiment of the present invention uses the UBM 78 formed only on the bump pad 76, the UBM 78 may be formed extending on the second polymer layer 74 around the bump pad 76.

Figure 1:
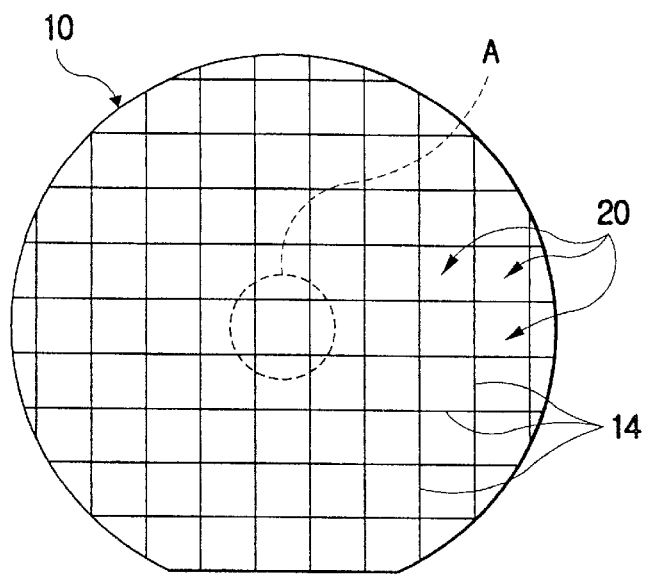
FIG. 1 is a plan view of a semiconductor wafer.
Figure 2:
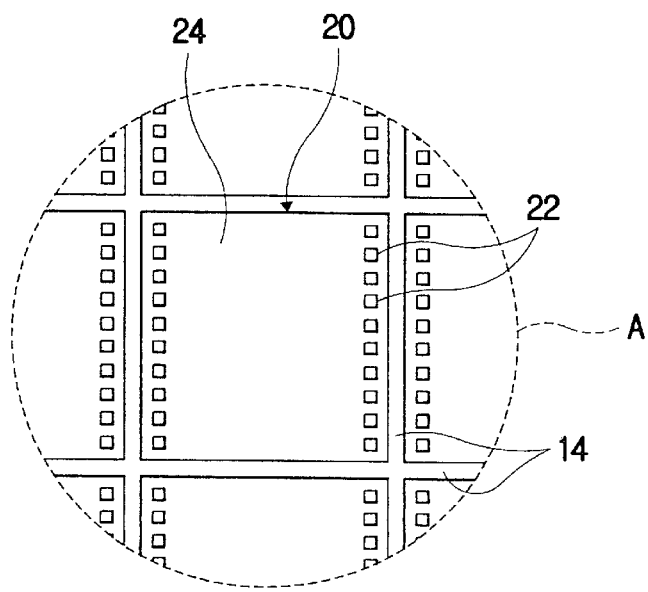
FIG. 2 is an enlarged plan view of the portion A of FIG. 1.
Figure 3:
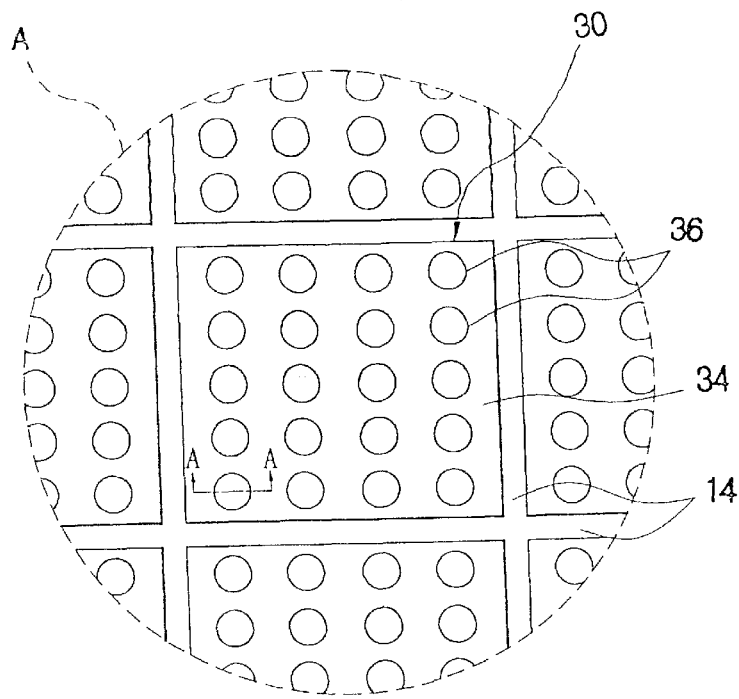
FIG. 3 is a partial plan view of wafer conventionally processed to have multiple chip scale packages.
Figure 4:
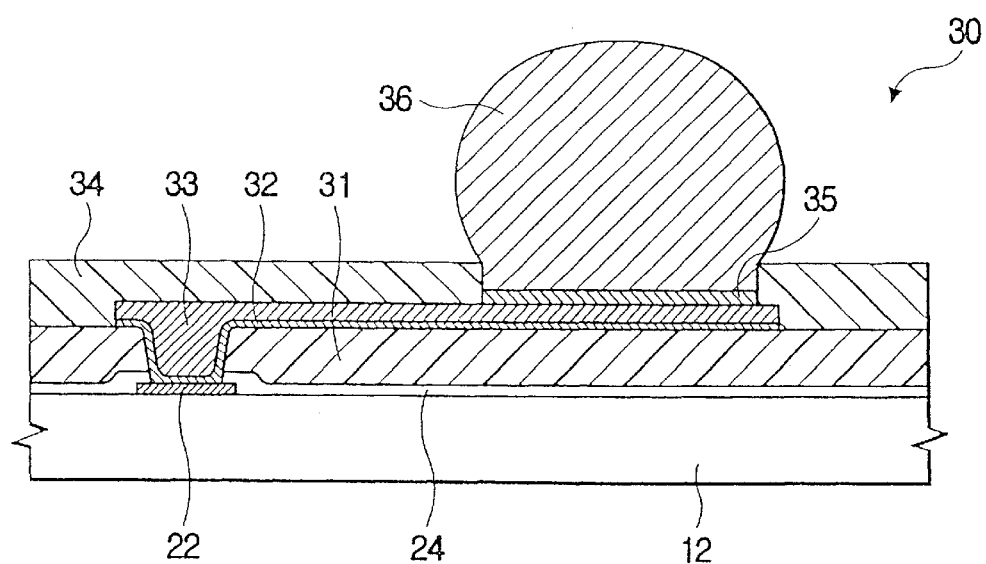
FIG. 4 is a cross-sectional view taken along lines A—A of a chip scale package in FIG. 3.
Figure 5:
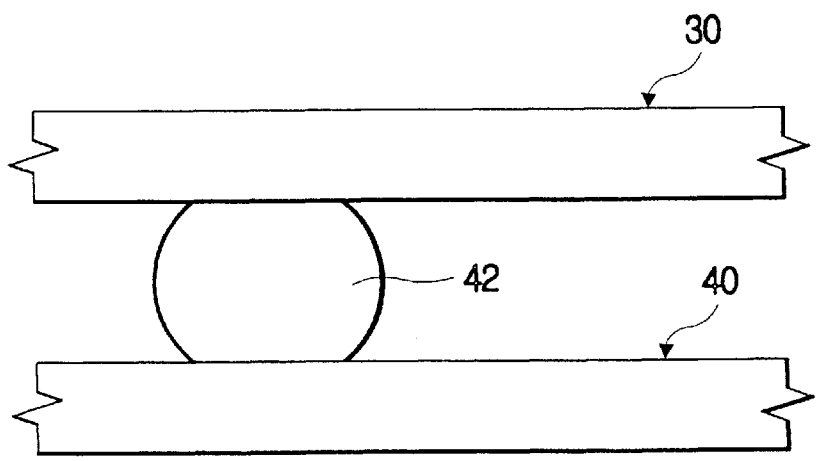
FIG. 5 is a cross-sectional view showing a conventional solder joint between the chip scale package and a substrate.
Figure 6:
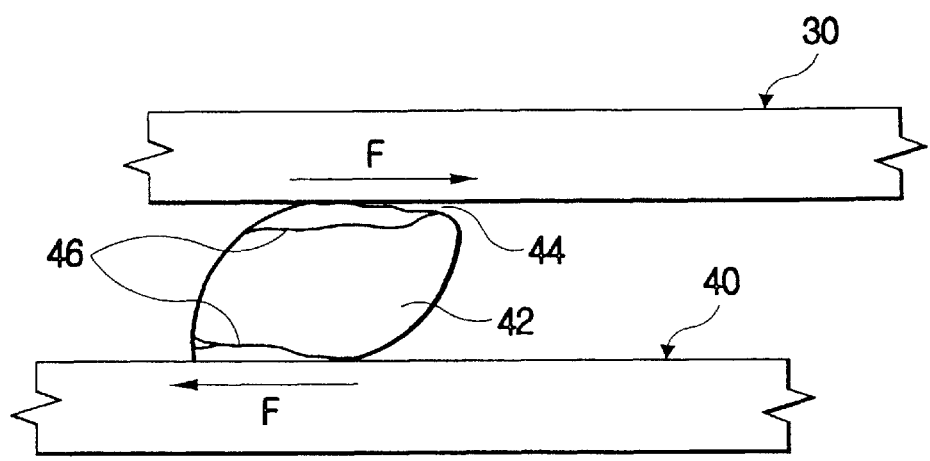
FIG. 6 is a view showing failures of a conventional solder joint.

The solder bump 80 is formed by providing solder with various methods such as plating, ball placement, or stencil printing methods, and subsequently subjected to the reflow soldering process. The solder bump 80 has a diameter of approximately 400 μm. The packages 90 at wafer level are completed with forming the solder bumps 80. The wafer is scribed along the scribe lines 14 (FIG. 3), and separated into a plurality of individual packages.

As shown in FIGS. 16 and 17, the interface between the bump pad 76 and the solder bump 80 extends into the concave pattern 68. Therefore, compared to the conventional structure of the solder bump, the overlapping area between the solder bump 80 and the bump pad 76 is increased, and thereby the adhesive strength is improved. If the area of the concave pattern 68 is less than 10% of the area of the bump pad 76, the adhesive strength is insignificantly improved. While, if the area of the concave pattern 68 is more than 50% of the area of the bump pad 76, the joint area between the solder bump 80 and the redistribution pattern 64 is reduced, and thereby the electrical connection is unreliable. Therefore, it is preferable that the concave pattern 68 has an area of 10% to 50% of that of the bump pad 76.

Figure 18:
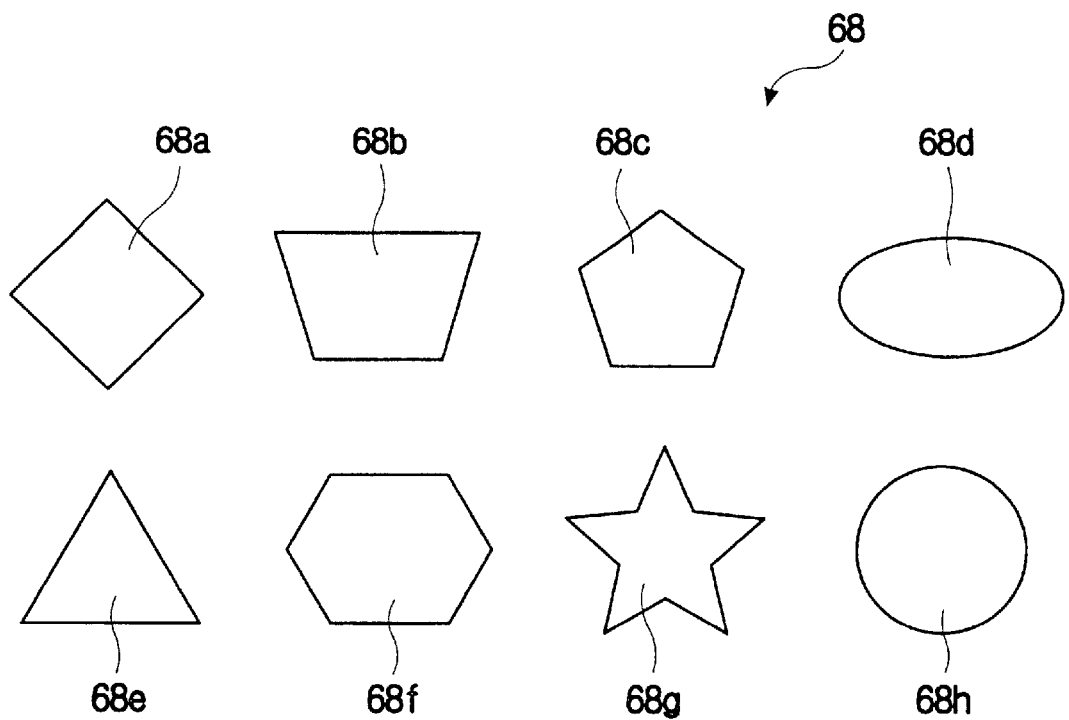
FIG. 18 illustrates various shapes of a concave pattern in the bump pad, according to the present invention.
Figure 19:
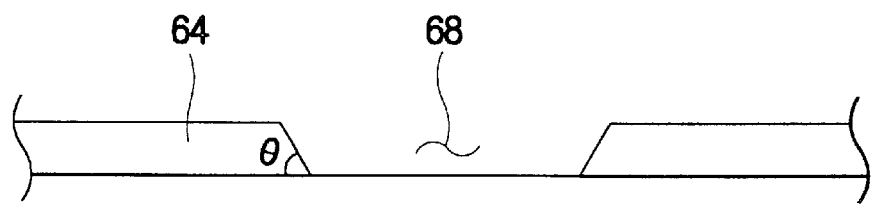
FIG. 19 is a cross-sectional view of the concave pattern in a bump pad, showing an angle of the inclination of the concave pattern.

Concave pattern 68 is shaped to provide for easy air flow from the concave pattern during the reflow soldering process. Referring to FIG. 18, the concave pattern 68 may have various shapes such as diamond 68*a*, trapezoid 68*b*, pentagon 68*c*, oval 68*d*, triangle 68*e*, hexagon 68*f*, star 68*g*, circle 68*h*, or similar patterns. With reference to FIG. 19, preferably, an angle of the inclination θ of the walls of concave pattern 68 is 45° to 90°, to facilitate the flow of the molten solder.

As described above, the chip size package of the present invention has the concave pattern in the bump pad area, and thereby the interface between the bump pad and the solder bump is not flat, but rather is stepped to provide a concave pattern. Therefore, the concave pattern in the bump pad increases the joint area between the solder bump and the bump pad and improves the adhesive strength, and improves the reliability of the solder joint.

Since the concave pattern is formed simultaneously with forming the redistribution pattern, additional equipment or process is not required and there is no increase in production costs.

Although specific embodiments of the present invention have been described in detail hereinabove, it should be understood that many variations and/or modifications of the basic inventive concepts herein taught still fall within the spirit and scope of the present invention as defined in the appended claims.

We claim:

1. A semiconductor device comprising:

a semiconductor integrated circuit chip having a semiconductor substrate, a plurality of chip pads and a passivation layer positioned on a surface of the semiconductor substrate, the passivation layer including openings therein to expose the chip pads;

a first polymer layer formed on the passivation layer and having a first plurality of openings for exposing the chip pads;

a patterned first barrier metal layer formed on the chip pads and the first polymer layer; and a plurality of electrically conductive redistribution patterns formed on the first barrier metal layer, each of the redistribution patterns including a bump pad area which includes a concave pattern, and including a chip pad contact portion that is electrically connected to an associated chip pad.

2. The semiconductor device according to claim 1, further comprising:

a second polymer layer formed on the first polymer layer and the plurality of redistribution patterns and having a second plurality of openings, one for each bump pad area;

a second baffler metal layer formed on each of the redistribution patterns; and a solder bump positioned on each of the bump pad areas and extending into the concave pattern of each bump pad area.

3. The semiconductor device according to claim 2, further comprising a third baffler metal layer positioned in each of the bump pad areas and interposed between the second barrier metal layer and a portion of the solder bump.

4. The semiconductor device according to claim 1, wherein an area of the concave pattern is approximately 10% to 50% of the area of the bump pad.

5. The semiconductor device according to claim 1, wherein the concave pattern includes a side wall which is inclined at an angle of approximately 45° to 90° with respect to a surface of one of the redistribution patterns.

6. A semiconductor device comprising:

a semiconductor integrated circuit chip having a semiconductor substrate, a plurality of chip pads and a passivation layer positioned on a surface of the semiconductor substrate, the passivation layer including openings therein to expose the chip pads;

a first polymer layer formed on the passivation layer and having a first plurality of openings for exposing the chip pads;

a patterned first baffler metal layer formed on the chip pads and the first polymer layer;

a plurality of redistribution patterns formed on the first barrier metal layer, each redistribution pattern having a portion connected to the chip pads and having an aperture that is formed within a bump pad area; and a second barrier metal layer formed on the plurality of redistribution patterns so that it is disposed within the aperture, contacting the first barrier layer.

7. The semiconductor device according to claim 6, further comprising:

a third barrier metal layer formed on the second barrier metal layer and located in the bump pad area, the third barrier metal layer comprising a concave pattern having sidewalls; and a solder bump positioned on each of the bump pad areas and extending into the concave pattern to contact the sidewalls of the concave pattern.

8. The semiconductor device according to claim 7, further comprising:

a second polymer layer formed on the second baffler layer and additionally in contact with at least one of the third baffler metal layer, plurality of redistribution patterns, first polymer layer and patterned first baffler metal layer.

9. The semiconductor device according to claim 6, wherein an area of the concave pattern is approximately 10% to 50% of the area of the bump pad.

10. The semiconductor device according to claim 7, wherein said sidewalls are inclined at an angle of approximately 45° to 90° with respect to a surface of one of the redistribution patterns.

* * * * *